United States Patent [19]

Hoberman et al.

[11] Patent Number: 4,864,165
[45] Date of Patent: Sep. 5, 1989

[54] ECL PROGRAMMABLE LOGIC ARRAY WITH DIRECT TESTING MEANS FOR VERIFICATION OF PROGRAMMED STATE

[75] Inventors: Barry A. Hoberman, Mountain View; William E. Moss, Sunnyvale, both of Calif.

[73] Assignee: Advanced Micro Devices, Inc., Sunnyvale, Calif.

[21] Appl. No.: 141,239

[22] Filed: Jan. 5, 1988

Related U.S. Application Data

[62] Division of Ser. No. 715,141, Mar. 22, 1985.

[51] Int. Cl.[4] .................. H03K 19/086; H03K 19/003
[52] U.S. Cl. ..................................... 307/467; 307/465; 324/73 R; 371/15.1; 371/25.1; 340/825.84
[58] Field of Search ..................... 307/202.1, 465, 466, 307/475; 364/716; 340/825.83, 825.84; 371/15-17, 19, 21, 25, 10; 365/201, 96; 324/73 PC, 550, 73 R

[56] References Cited

U.S. PATENT DOCUMENTS

| | | | |
|---|---|---|---|
| 4,464,750 | 8/1984 | Tatematsu | 365/201 X |
| 4,595,875 | 6/1986 | Chan et al. | 324/73 PC |
| 4,607,177 | 8/1986 | Lechner | 307/475 |
| 4,625,129 | 11/1986 | Ueno | 307/446 |
| 4,625,162 | 11/1986 | Bosnyak | 371/25 X |
| 4,625,311 | 11/1986 | Fitzpatrick et al. | 371/21 X |
| 4,638,243 | 1/1987 | Chan | 371/25 X |
| 4,658,253 | 4/1987 | Johnson | 340/825.84 |
| 4,670,708 | 6/1987 | Bosnyak et al. | 324/73 PC |
| 4,698,589 | 10/1987 | Blankenship et al. | 324/550 |
| 4,701,695 | 10/1987 | Chan et al. | 324/73 PC |
| 4,730,273 | 3/1988 | Sluss | 365/96 |

FOREIGN PATENT DOCUMENTS

| | | |
|---|---|---|
| 0093996 | 5/1983 | European Pat. Off. . |
| 0105685 | 9/1983 | European Pat. Off. . |

OTHER PUBLICATIONS

Cavlan, "Field-PLAs Simplify Logic Designs", Electronic Design, 9-1-75, pp. 84-90.
Paper entitled "A 3.6 ns ECL Programmable Array Logic IC", by Michael S. Millhollan et al., IEEE International Solid-State Circuit Conference, vol. 28, Feb. 1985, 32nd Conf., Coral Gables, Session XV: High Speed Array, pp. 202-203, IEEE, New York, U.S.
Schmitz et al., "Semi-Custom Arrays", IEEE, SSC Conf., San Fran., 2/1984.

Primary Examiner—John S. Heyman
Assistant Examiner—Timothy P. Callahan
Attorney, Agent, or Firm—Skjerven, Morrill, MacPherson, Franklin & Friel

[57] ABSTRACT

A novel ECL Programmable Logic Array (PLA) is provided which operates as an ECL PLA, having ECL voltage level compatible input and output leads, thereby providing a high-speed PLA. A unique programming means is provided which allows the ECL PLA to be programmed using TTL-compatible programming voltage levels, such as are provided by common and inexpensive prior art TTL PLA programmers. In another embodiment higher speed is achieved by the design of each sense amplifier using emitter function logic such that the sense transistor and load functions a cascode amplifier. In another embodiment a lower power PLA device is achieved by utilizing a switched current source pull down means for pulling down the rows of the PLA array. In another embodiment low power and user convenience is achieved by allowing each pair of output terminals to share a predefined set of product terms. In another embodiment of this invention, each output terminal is capable of having its output polarity programmed, in order to provide either a desired product term, or the inverse of that product term.

5 Claims, 7 Drawing Sheets

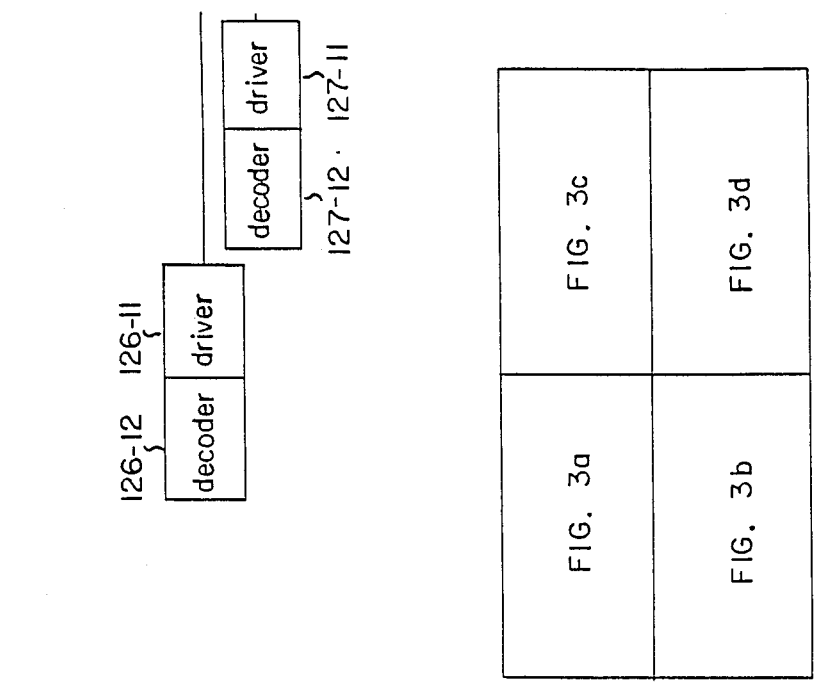
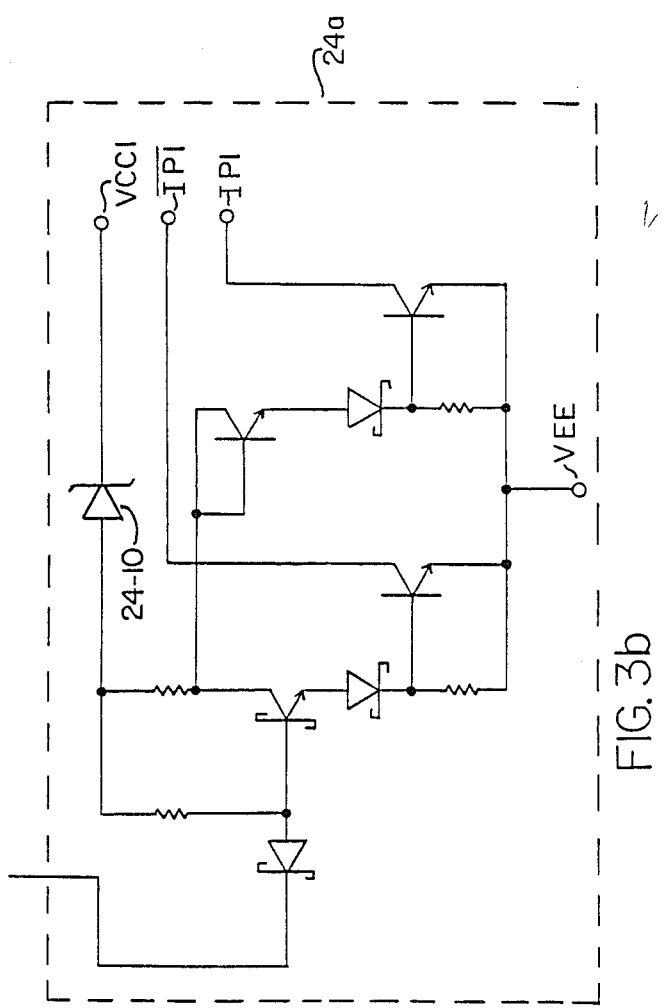
FIG. 3
FIG. 3b

ECL PROGRAMMABLE LOGIC ARRAY WITH DIRECT TESTING MEANS FOR VERIFICATION OF PROGRAMMED STATE

This application is a division of application Ser. No. 06/715,141, filed 03/22/85.

BACKGROUND

This invention relates to programmable logic arrays (PLAs), and more particularly to a unique programmable logic array utilizing emitter-coupled logic to achieve unprecedented speed, while including TTL-compatible programming circuitry in order to allow the programmable logic array device constructed in accordance with the teachings of this invention to be programmed utilizing standard, inexpensive, prior art TTL programmable logic array programmers.

Programmable logic arrays are well known in the art. Programmable logic arrays typically comprise an array of cells, each cell comprising an access means and a programmable element, such as a fuse. A plurality of such cells are connected in order to provide a product term, which is the mathematical result of a boolean equation performed on a plurality of input signals. The PLA array includes a number of cells configured in order to provide a number of such product terms operating on said input signals. Such prior art PLA devices include the PAL family of devices manufactured and sold by Monolithic Memories, Inc., the assignee of this application. PAL is a registered trademark of Monolithic Memories, Inc.

There are many varieties of PLAs, primarily distinguished by their size, organization, and technology (i.e. bipolar, MOS, CMOS). In addition, "*An ECL Field Programmable Logic Array,*" Schmitz and Hingarh, ISSCC, Issue 84, Page 264, describes an emitter coupled logic (ECL) programmable logic array. However, this ECL PLA required an extremely high amount of power (typically 4.75 watts during both programming and normal operating conditions). In addition, the above-mentioned paper did not describe an ECL PLA which could be programmed using a standard TTL PLA programmer. Accordingly, power dissipation was a problem, as well as requiring very specialized and expensive equipment in order to program the PLA. Furthermore, because of the problems with programming this prior art ECL PLA, the device was very expensive. With increasing complexity and sophistication in the electronics marketplace, higher-speed PLAs have become necessary. The typical access time (i.e. the time from the application of the input signals to a PLA device to the provision of product terms on the output leads of the device) are approximately 15 nanoseconds for state-of-the-art TTL PLAs, 30–40 nanoseconds for CMOS PLAs, and approximately 4 nanoseconds for ECL PLAs. Accordingly, it is desirable to provide an ECL PLA for higher speeds, yet which does not required specialized and expensive equipment for programming.

SUMMARY

In accordance with the teachings of this invention, a novel ECL PLA is provided which operates as an ECL PLA, having ECL voltage level compatible input and output leads, thereby providing a high-speed PLA. Furthermore, in accordance with the teachings of one embodiment of this invention, a unique programming means is provided which allows the ECL PLA to be programmed using TTL-compatible programming voltage levels, such as are provided by common and inexpensive prior art TTL PLA programmers. In accordance with yet another embodiment of this invention, an ECL PLA is provided in which higher speed is achieved by the design of each sense amplifier using emitter function logic such that the sense transistor and load functions as a cascode amplifier. In accordance with another embodiment of this invention, a lower power PLA device is achieved by utilizing a switched current source pull down means for pulling down the rows of the PLA array. In accordance with another embodiment of this invention, low power and user convenience is achieved by allowing each pair of output terminals to share a predefined set of product terms. In accordance with the teachings of another embodiment of this invention, each output terminal is capable of having its output polarity programmed, in order to provide either a desired product term, or the inverse of that product term.

BRIEF DESCRIPTION OF THE DRAWINGS

FIG. 3 depicts the interrelationships between FIGS. 3a through 3d;

FIGS. 3a through 3d form a schematic diagram illustrating one embodiment of a PAL device constructed in accordance with this invention.

DETAILED DESCRIPTION

Figure 1:
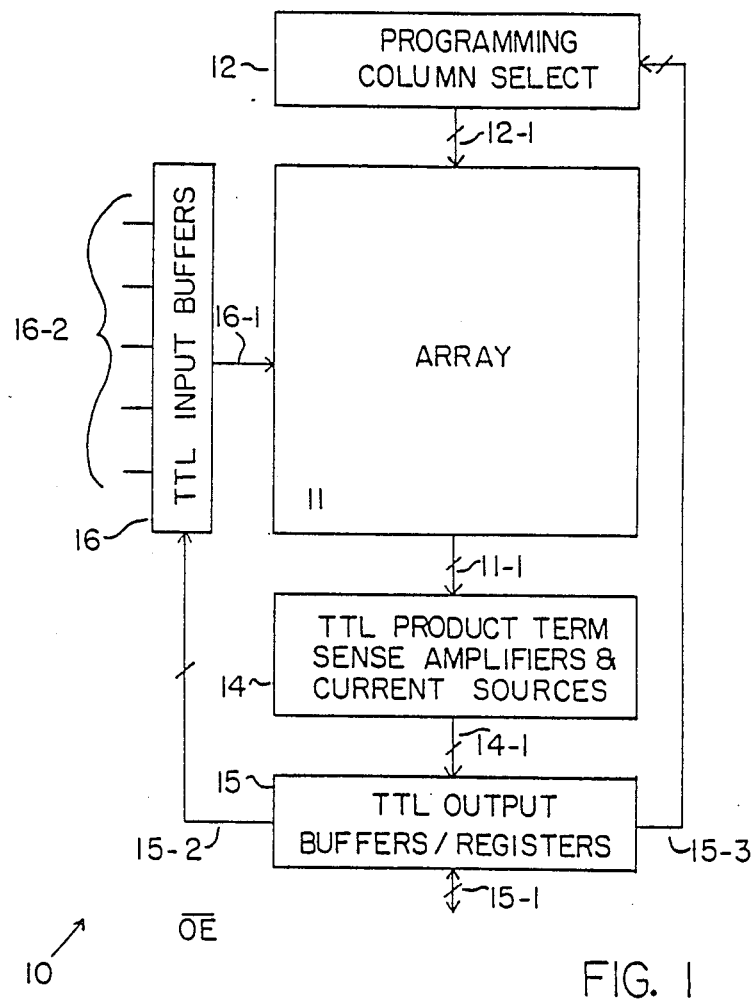
FIG. 1 is a block diagram of a prior art TTL PAL circuit.

FIG. 1 is a block diagram of a prior art TTL PAL circuit manufactured by Monolithic Memories, Inc. PAL circuit 10 includes array 11 which, as previously described, comprises a plurality of cells, each cell including access means and a programmable element, such as a fuse. PAL circuit 10 also includes TTL input buffers 16, which receive input signals from input leads 16-2 and input signals which are provided by TTL output buffers/registers 15 via bus 15-2. Accordingly, bus 16-1 includes a number of input data leads equal to twice the number of input data leads in bus 16-2 plus the number of data leads in bus 15-2, since complementary input signals are provided to array 11 from TTL input buffers 16. These input signals are applied to array 11, which in turn combines them in an NAND function in order to provide a plurality of product terms. These product terms are provided via bus 11-1 to TTL product term sense amplifiers and current sources 14, which combines selected product terms in an OR function in order to provide output signals on bus 14-1 to TTL output buffer/register 15. TTL output buffers/registers 15 in turn provides these signals via bus 15-2 to TTL input buffers 16, as previously described, and to external pins via output bus 15-1.

Array 11 is programmed by opening selected fuses within array 11 by performing a programming operation. During this programming operation, the power supply Vcc applied to the device is typically raised from its normal operating voltage of approximately 5 volts to its programming operating voltage of approximately 12 volts to enable the programming function. During programming, the OUTPUT ENABLE terminal (not shown) of TTL output buffers/registers 15 is held high in order to disable TTL output buffers/registers 15. The input leads forming input bus 16-2 are then used to select an appropriate row within array 11 for programming. During programming, the output leads forming output bus 15-1 are used as input leads in order to choose a selected cell contained within the selected row in which it is desired to open the fuse. These input signals are fed from TTL output buffers/registers 15 via bus 15-3 to programming column select circuitry 12, which provides a high current to the selected cell, sufficient to open the fuse of the selected cell. This programming operation is continued in order to open, one at a time, each desired fuse within array 11.

Figure 2:
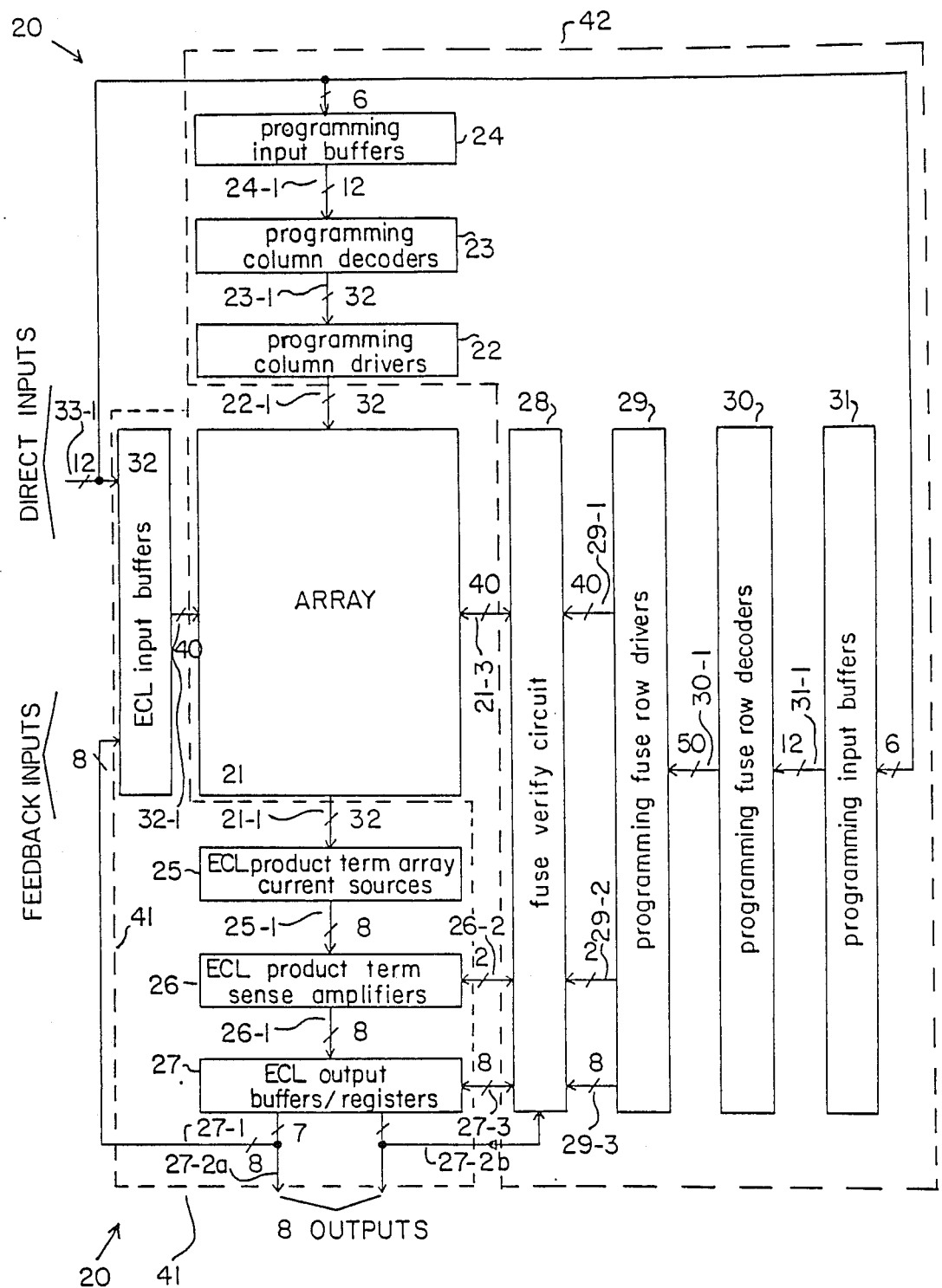
FIG. 2 is a block diagram of one embodiment of a novel PAL device constructed in accordance with this invention.

FIG. 2 is a block diagram of one embodiment of a unique ECL PAL device constructed in accordance with the teachings of this invention which includes TTL programming means. PAL device 20 includes product term fuse array 21, programming circuitry 42, and normal operating circuitry 41. As in the prior art circuit of FIG. 1, normal operating circuitry 41 includes input buffers 32, product term array current sources 25, product term sense amplifiers 26, and output buffers/registers 27. In accordance with the teachings of this invention, each of these elements is fabricated using ECL technology in order to achieve maximum operating speed. Programming circuitry 42 includes programming input buffers 24, programming column decode circuitry 23, programming column drivers 22, programming input buffers 31, programming fuse row decoders 30, programming fuse row drivers 29, and fuse verify circuitry 28.

Figure 3A:
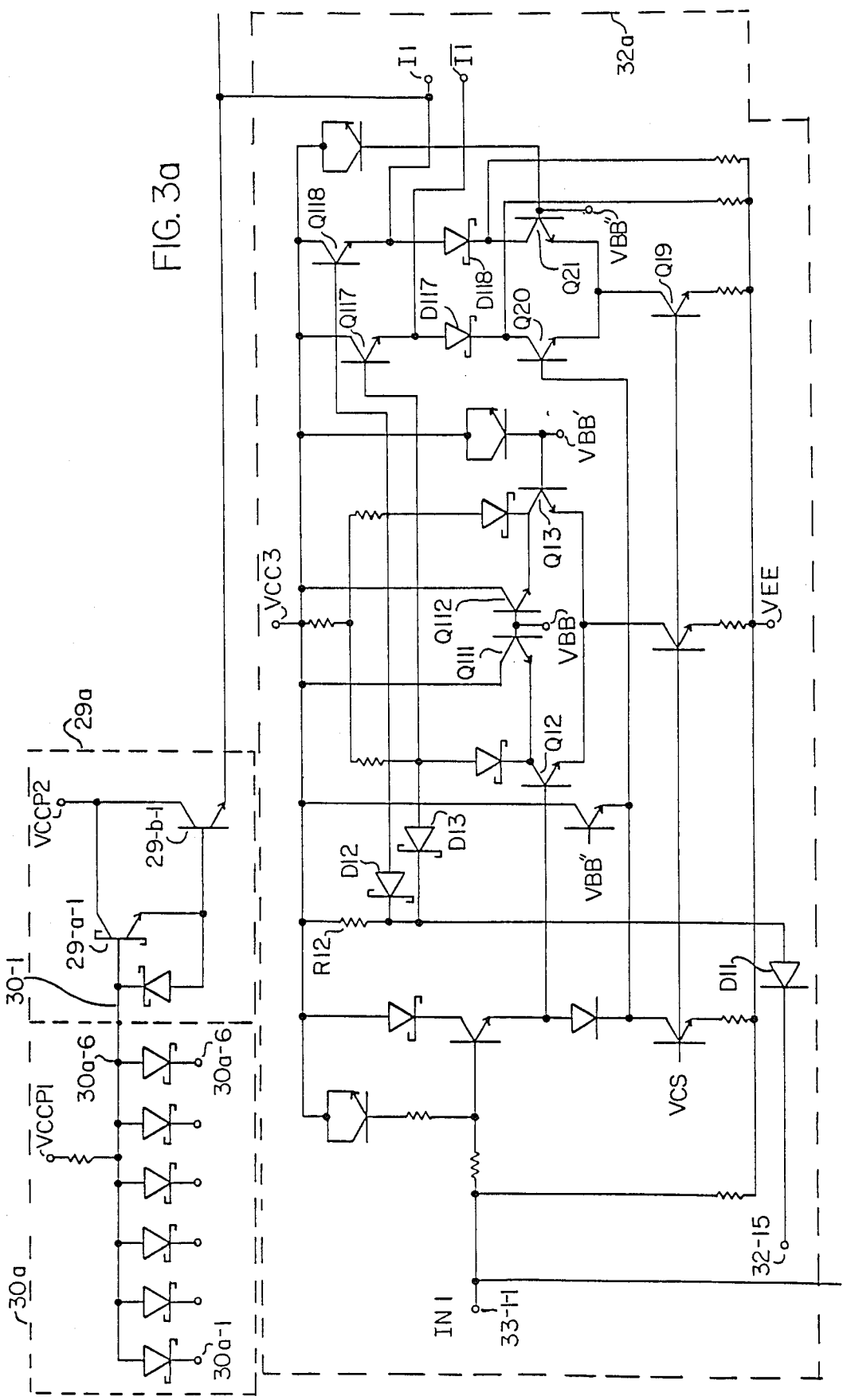
Figure 3C:
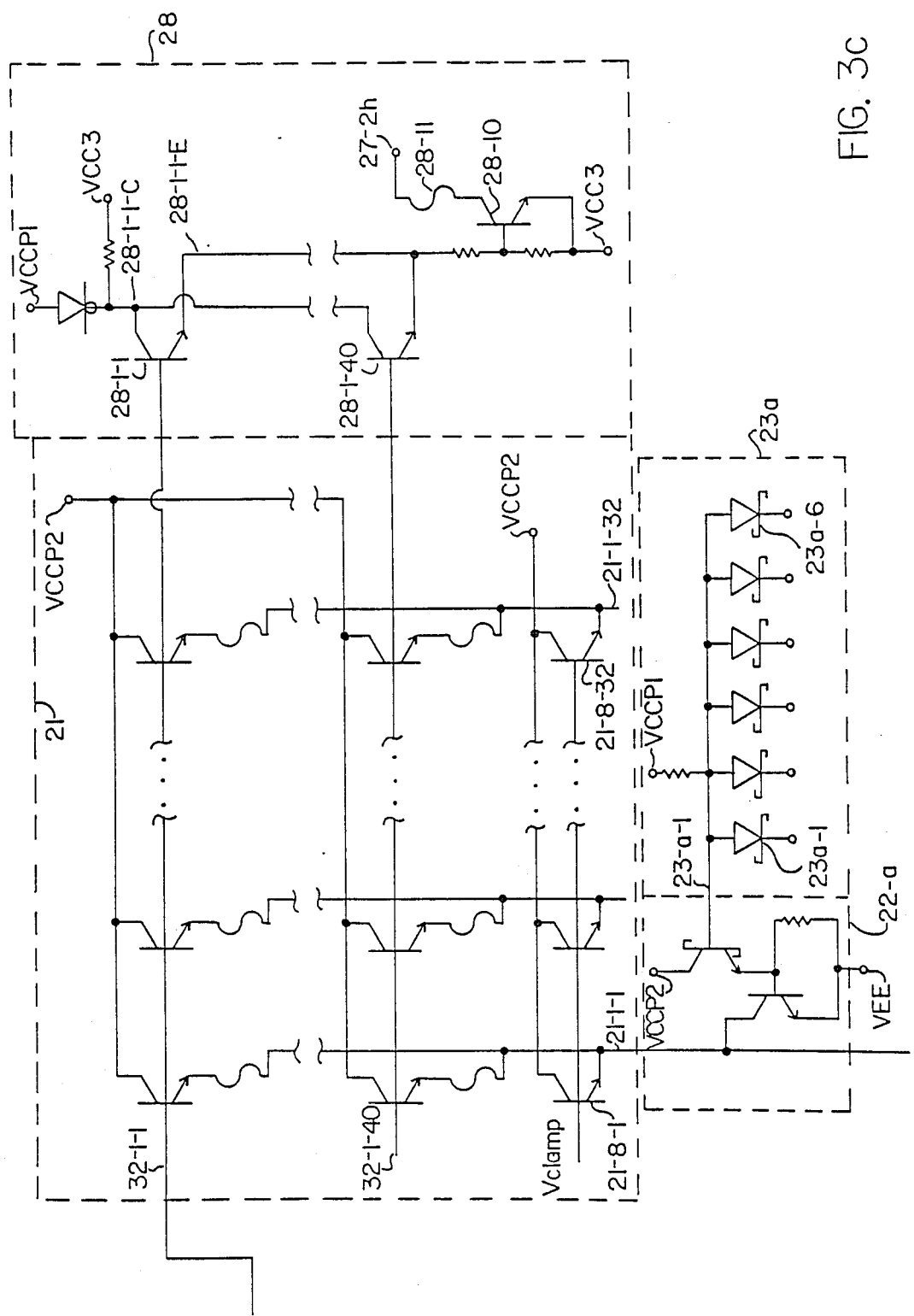
Figure 3D:
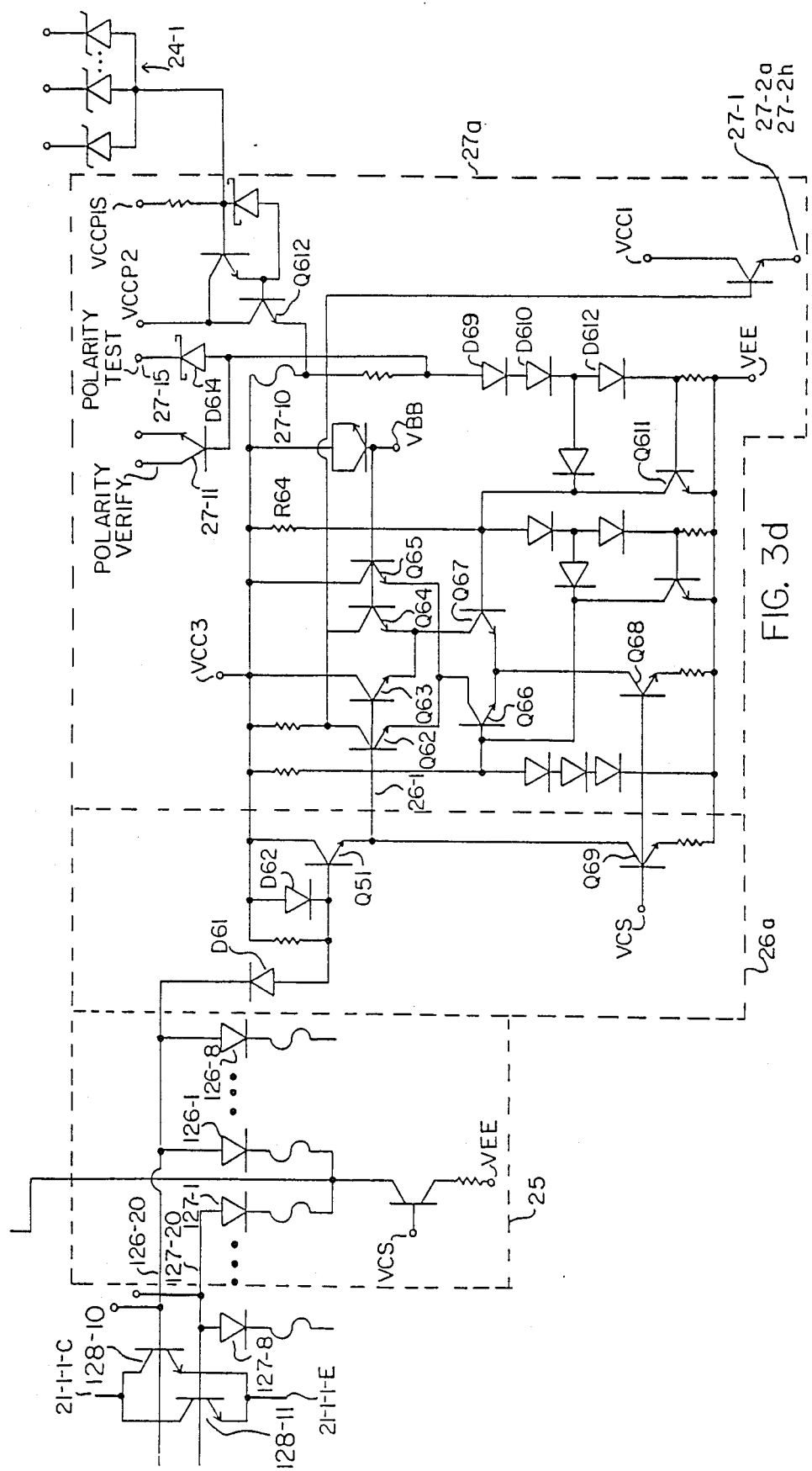

FIG. 3 depicts the interrelationship between FIGS. 3a through 3d, which form a schematic diagram of one embodiment of an ECL PAL device constructed in accordance with the teachings of this invention. Portions of the circuit of FIG. 3 are shown in dashed boxes and are numbered in order to correspond with portions of the ECL PAL device shown in the block diagram of FIG. 2.

Referring now to FIG. 3c, array 21 includes a plurality of cells, each cell including an access transistor and a programmable element, such as a fuse. Fuses commonly used in PLA devices include polycrystalline silicon, nichrome, titanium tungsten, and platinum silicide, all well known in the art. Each of the access transistors has its collector connected to a voltage source VCCP2 (typically −0.5 volts during normal operation of the device, and approximately 7.5 volts during the programming mode). The voltage levels of VCCP2, as well as other voltage levels of the ECL PLA device of this embodiment of this invention are more fully described in Table 1. The cells contained within array 21 are organized in a plurality of rows and columns. The bases of each of the access transistors contained in a single row are connected in common, as shown for example by leads 32-1-1 of FIG. 3c. Each row receives a buffered input signal, either from an external lead of the ECL PLA device (shown as direct input leads contained within bus 33-1 of FIG. 2) or from a feedback input lead contained within bus 27-1 (shown in FIG. 2). In the embodiment of this invention shown in FIG. 2, there are 12 direct input leads and eight feedback input leads. Thus, there are a total of 40 rows contained within array 21 (one row of each input signal, and one row for the complement of each input signal). If desired, array 21 can also include one or several additional test rows (not shown) used for testing purposes by the manufacturer, as is well known to those of ordinary skill in the art. The emitters of each of the access transistors are connected through an assoicated fusible element to a plurality of product term lines 21-1-1 through 21-1-32. In this embodiment of this invention, array 21 includes a plurality of 32 product term lines. As is well known to those of ordinary skill in the art, array 21 can also include one or more additional product term lines (not shown) used solely by the manufacturer for testing the device.

During operation of the PLA device of FIGS. 2 and 3, a plurality of input signals IN1 through IN12 are applied via direct input bus 33-1 and buffered by a plurality of 12 input buffers operating at ECL voltage levels (such as input buffer 32-a of FIG. 3a which receives input signal IN1). Buffer 32-a provides a buffered version of its input signal (I1 corresponding to input signal IN1), and a buffered complement signal (Ī1 corresponding to the complement of input signal IN1). Thus, a plurality of 12 direct input buffers such as buffer 32-a provide a plurality of 24 output signals, each such output signal being applied to a unique one of row lines such as 32-1-1. Thus, 24 of the 40 rows contained within array 21 are driven by direct input buffers 32. Furthermore, not shown in FIG. 3 are a plurality of eight additional feedback input buffers having the same circuit configuration as buffers 32-a. These feedback input buffers, rather than receiving direct externally-applied input signals as do input buffer 32-a, receive feedback input signals from ECL output buffer/registers 27 (FIG. 2 and FIG. 3d) and provide 16 buffered complementary feedback data signals for driving the remaining 16 rows of array 21. Since each column within array 21 functions as a wired NAND gate, by applying these buffered signals to rows within array 21, each product term line 21-1-1 through 21-1-32 provides a logical 1 when the input signals applied to its access transistors correspond to the pattern of opened fuses along that product term line. For example, if all the fuses along a product term column are opened with the exception of one, a logical 0 applied to that cell causes the product term to be a low voltage which is equivalent to a logical 1. Conversely, with a logical 1 (high voltage) applied to that cell, the product term line is brought to a high voltage corresponding to a logical 0. In this manner, any desired combination of input signals can be programmed to provide a logical 1 or alternatively a logical 0 product term as desired.

A unique feature of the input buffers constructed in accordance with the teachings of this invention, such as input buffer 32-a, is the use of a single, large current supply which is selectively switched between complementary output leads. In prior art circuits, each output lead of a complementary buffer includes an associated current supply for pulling down each output lead during the logical 1 to logical 0 transition, which necessitates either providing a large amount of current, or reducing the current made available by each of these current sources, thereby degrading the speed of the logical 1 to logical 0 transitions. In contrast, in accordance with the teachings of this invention a single current source is associated with both output leads I1 and Ī1. Transistor Q19 provides a large amount of current, typically 2.5 milliamps, which is switched by current steering transistors Q20 and Q21 such that the current supplied by transistor Q19 is made available to only the single one of output leads I1 or Ī1 which is undergoing a logical 1 to logical 0 transition.

As shown in FIG. 3c, each product term line 21-1-1 through 21-1-32 includes a voltage clamping transistor (21-8-1 through 21-8-32, respectively) having its base connected to a clamp voltage $V_{clamp}$ (typically −2.1 volts), its collector connected to VCCP2, and its emitter connected to its associated product term line. Clamp transistors 21-8-1 through 21-8-32 serve to limit the lower voltage excursion of their associated product term lines, 21-1-1 through 21-1-32, respectively, thereby ensuring that each product term current source 25, shown in FIGS. 2 and 3d, remains in a linear active region and does not saturate. Should product term current source 25 saturate, an inordinate amount of base current would be drawn from voltage source Vcs, thereby disturbing the precise voltage level of voltage referenc Vcs, thereby adversely affecting the operation of the entire ECL PLA.

In accordance with the teachings of this invention, the product term signals provided on product term lines 21-1-1 through 21-1-32 are connected in a wired logical NOR function prior to being applied to ECL output buffer/register 27 for providing output signals. In one embodiment of this invention, eight output terminals are provided (and thus eight output buffers 27a through 27h form output buffers/registers 27), divided into four pairs of output terminals. Each pair of output leads can share, on a mutually exclusive basis between themselves, a total of eight product terms. This is accomplished by utilizing additional fuses as shown in FIG. 3d. Diodes 126-1 through 126-8 have their anodes connected in common, and their cathodes connected through their accompanying fuses to one of eight product terms. By programming these fuses, the connection of these eight product terms to the wired NOR gate formed by diodes 126-1 through 126-8 is accomplished. Similarly, diodes 127-1 through 127-8, with the aid of programming fuses, determine which of the eight product terms are to be connected to an additional output buffer (not shown). The programming rules for this embodiment of this device require that a single product term not be connected via a wired OR function to more than one output buffer. Naturally, to those of ordinary skill in the art, minor modifications to the circuitry will become apparent in light of the teachings of this invention which will permit one to utilize a single product term in connection with more than one output buffer.

The signal resulting from the wired NOR operation of diodes 126-1 through 126-8 is connected to the cathode of diode D61, whose anode is connected to the base of NPN transistor Q51. NPN transistor Q69 serves as a current source, providing current to the emitter of transistor Q51. If the signal applied to the cathode of diode D61 is a low voltage, diodes D61 and D62 conduct current, thereby causing the voltage applied to the base of transistor Q51 to be one diode drop below the voltage level of VCC3, thereby providing a low voltage (logical 0) to input lead 26-1 of output buffer 27. Conversely, with a high voltage applied to the cathode of diode D61, diodes D61 and D62 do not conduct current, the voltage applied to the base of transistor Q51 is held to a value slightly less than VCC3, and the voltage on input lead 26-1 of output buffer 27 is high (logical 1). Output buffer 27 buffers the input signal on lead 26-1 and provides a buffered output signal on output lead 27-1.

Figure 4:
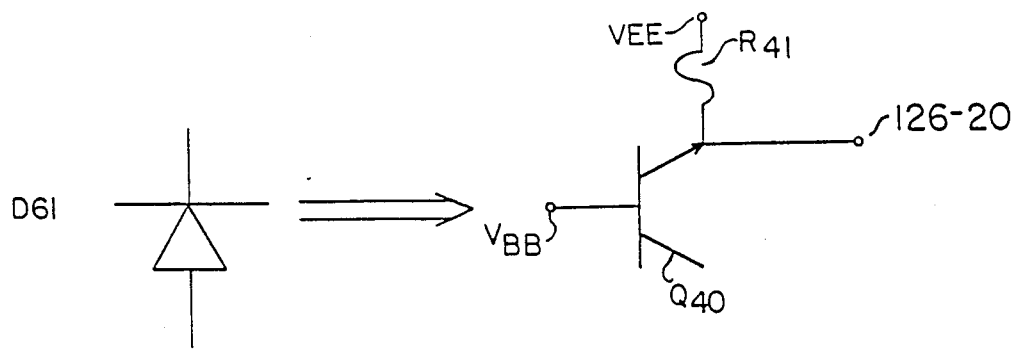
FIG. 4 is a schematic diagram depicting a portion of another embodiment of the circuit of FIG. 3.

In accordance with the teachings of another embodiment of this invention, the speed-power performance of the device is improved by replacing diode D61 in ECL product term sense amplifiers 26 (such as sense amplifier 26a of FIG. 3d) with an NPN transistor as shown in FIG. 4. NPN transistor Q40 has its base connected to a bias supply $V_{BB}$, its collector connected to the base of transistor Q51 (FIG. 3d), and its emitter connected to lead 126-20. Optimally, resistor R41 will be included between the emitter of transistor Q40 and the supply voltage $V_{EE}$, resistor R41 having a relatively high resistance value (typically 30–50 k) which serves to ensure that transistor Q40 is always turned on, at least slightly, even when no product terms are selected, thereby minimizing the voltage swing on lead 126-20. Minimizing the voltage swing on lead 126-20 is important, since lead 126-20 tends to be highly capacitive due to the number of diodes (such as diodes 126-1 through 126-8) connected to it. Furthermore, in order to replace diode D61 with transistor Q40 as shown in FIG. 4, a minor modification to input buffer 32 is required. In input buffer 32, the voltage levels of signals I1 and Ī1 must be level shifted downward by one diode drop. An easy way to accomplish this is to insert a diode (not shown) having its anode connected to the emitter of transistor Q117, its cathode connected to the anode of diode D117, and the I1 signal line connected between the cathode of the inserted diode and the anode of diode D117. Similarly, an additional diode (not shown) is inserted having its anode connected to the emitter of transistor Q118 and its cathode connected to the anode of diode D118, with the Ī1 signal line being connected between the cathode of the inserted diode and the anode of diode D118.

In accordance with the teachings of one embodiment of this invention, output buffer 27, shown in FIGS. 2 and 3d, includes means for providing a programmable output polarity. In other words, the output signal on output lead 27-1 can be either the buffered version of the input signal applied to input lead 26-1 of output buffer 27, or a buffered version of the inverse of the signal applied to input lead 26-1 of buffer 27. This programmable output polarity function is provided as follows. Polarity fuse 27-10 serves to define whether output buffer 27 is to provide inverted output signals. When polarity fuse 27-10 is intact, current flows from VCC3 through diodes D69, D610, and D612, thereby turning on NPN transistor Q611 and thus pulling down the base of NPN transistor Q67. The current provided by current source transistor Q68 thus is steered through NPN transistor Q66 and the differential transistor pair Q62, Q65 is selected for switching the inverted output signal on output lead 27-1 of output buffer 27. Conversely, when fuse 27-10 is opened, no current flows through diodes D69, D610, and D612, transistor Q611 remains off, allowing the base of transistor Q67 to be pulled high by resistor R64, thus steering the current supplied by current source transistor Q68 through transistor Q67, thus selecting differential pair Q63, Q64, thereby providing a noninverted output signal on output lead 27-1.

The various fuses contained within the structure of FIG. 3c are programmed as follows. The fuses within array 21 are programmed by the following technique. First, the programming power supply voltages are applied to the device as more fully described in Table 1, previously mentioned. Next, 12 TTL-compatible input signals are applied to the 12 external direct input leads 33-1-1, shown in FIG. 3a, through 33-1-12 contained within bus 33-1 which define a unique one of the fuses contained within array 21 to be programmed. Each of these TTL-compatible input signals is applied to a TTL input buffer 24-a through 24-f and 31-a through 31-f (which form programming input buffers 24 and 31 of FIG. 2) which provide buffered and complementary output signals. As shown in FIG. 3b, one such TTL programming buffer 24-a buffers input signal IN1 in order to provide buffered signal IP1 and complementary buffered signal IP1. Of importance, each TTL programming buffer, such as buffer 24-a, is enabled by the application of a VCC1 signal of approximately 12 volts, sufficient to cause zener breakdown of zener diode 24-10, and thereby supply proper operating voltages to buffer 24a. Simultaneously, as shown in Table 1, during programming, both VCC3 and VEE are held at 0 volts, thereby removing all curent to input buffers 32 (such as input buffer 32a, shown in FIG. 3a). Furthermore, the reference voltages applied to input buffers 32 are generated from VCC3 and VEE, and thus the reference voltages applied to ECL input buffers 32 are also 0 volts during programming. Thus, input buffers 32 are completely disabled during programming.

Six parts of complementary buffered input signals are applied to programming fuse row decoder 30 (FIG. 2), and the remaining six pairs of buffered programming input signals are applied to programming column decoder 23 (FIG. 2). Each row decoder 30 and column decoder 23, such as decoder 30a of FIG. 3a, includes six Schottky diodes 30a-1 through 30a-6, each Schottky diode receiving one of each pair of complementary buffered input signals. In this manner, six programming input signals uniquely access each of the 40 rows within array 21. The selection of whether the cathode of each Schottky diode in row decoder 30a is applied to the buffered input signal, or the inverted buffered input signal, is preferably designed using the metal mask used to manufacture the integrated circuit, as is well known to those of ordinary skill in the art. Schottky diodes 30a-1 through 30a-6 of row decoder 30 function as a wired-AND gate, thereby providing a logical 1 signal to lead 30-1 when each input signal applied to the Schottky diodes 30a-1 through 30a-6 are logical ones. A logical 1 placed on lead 30-1 turns on the Darlington pair of NPN transistors 29a-1, 29b-1 contained within row driver 29, thereby supplying current to the selected row lead 31-1-1.

Similarly, the remaining six pairs of buffered input signals are applied to programming column decoder 23 (FIG. 2), which include decoder 23-a (FIG. 3c) which in turn contains six Schottky diodes 23a-1 through 23a-6 connected as a wired AND circuit. When each of the signals applied to the wired AND circuit of programming column decoder 23-a is a logical 1, the signal on lead 23-a-1 is a logical 1, thereby turning on Darlington pair of transistors contained within programming column driver 22-a, thereby sinking current from product term line 21-1-1. With current supplied to the base of the selected transistor, and current sunk from the product term associated with the selected transistor, a large current (typically 50 milliamps) flows through the fuse to be programmed, thereby causing the fuse to open. Each fuse within array 21 which is to be programmed is thus programmed in sequence.

After programming each of the fuses within array 21, in accordance with one embodiment of this invention, means are provided for verifying the state of each fuse contained within array 21. In contrast to prior art devices in which fuses are verified by comparing output signals provided in response to known input signals, in accordance with this embodiment of this invention fuses are verified directly. In order to accomplish this, VCCP2 is left in a high impedance state, and VCCP1 is held at approximately 4.5 volts. The 12 input leads of bus 33-1 (FIG. 2) are then used to again sequentially access each fuse within array 21. As each fuse is accessed, a small amount of current is provided by VCCP1 through the Darlington pair of row driver 29a whose collectors are open because VCCP2 is left in a high impedance state, thereby providing a relatively small amount of current to the selected row (typically 150 microamps). If the selected fuse is open, no current flows through the base-emitter path of the selected transistor to the product term line, causing the selected row to have a high voltage level (typically 1.5 volts). This high level voltage is applied to the base of that row's associated verifying transistor 28-1-1 through 28-1-40 contained within fuse verify circuit 28, thus causing that transistor to turn on thereby providing current to the base of fuse verify circuit output transistor 28-10, thus turning on transistor 28-10 and providing a logical zero output signal on verify output terminal 27-2h indicating that the selected fuse is open. Of importance, in this embodiment of this invention, transistor 28-10 operates as an open collector transistor and thus an external series resistance (not shown) must be used in order to prevent security fuse 28-11 from being opened inadvertently during the verifying process. The value of this series resistance is typically on the order of 5000 ohms.

Conversely, when a selected fuse has not been blown and remains intact, current flows from the selected row to the product term line and is sunk by enabled column driver 22. This pulls down (to approximately 1.0 volts) the selected row thus preventing that row's fuse verifying transistor from turning on, thus holding fuse verify circuit output transistor 28-10 off, thereby providing a logical 1 output signal on output lead 27-2h. In this manner, programming of array 21 can be verified for accuracy.

Subsequent to the verification of array 21, and all othe fuses contained within the circuit of FIG. 3, verify fuse 28-11 can itself be opened by passing a high current (typically 50 milliamps) in order to prevent unauthorized persons from verifying and thus being able to copy the contents of array 21 and the programmed state of all other fuses contained within the PLA device of FIG. 3. In order to open fuse 28-11, a fuse known to be opened is accessed in the verify mode, and the series resistance connected to lead 27-2h is omitted thereby providing sufficient current to open verify fuse 28-11. Alternatively, any row of array 21 is selected, and no product term is selected thereby preventing the selected row from being clamped low by an intact fuse, and the series resistance is omitted.

In order to program the product term sharing fuses, such as the fuses associated with diodes 126-1 through 126-8 and 127-1 through 127-8, addressing means are provided to leads 126-20 and 127-20 in order to select a single one of programming fuses 126-1 through 126-8 and 127-1 through 127-8. The decoders 126-12, 127-12 and drivers 126-11, 127-11, shown above FIG. 3, connected to terminals 126-20 and 127-20, respectively, are in one embodiment of this invention identical to the decoder 30a and drive 29a associated with row 32-1-1 of array 21, and thus are not shown again in detail in FIG. 3d. Programming buffer 31 supplies buffered input signals to decoders 126-12, 127-12. By selecting the desired bank of fuses to be programmed, and the desired product term associated with the fuse to be opened utilizing product term decoder 23 and product term driver 22, sufficient current (again typically 50 milliamps) is forced through the fuse to be opened. In order to verify the programmed state of these product term sharing fuses, each set of fuses and their accessing diodes, such as 126-1 through 126-8, include verify transistor 128-10, 128-11 connected in parallel with the verify transistors associated with array 21. Thereby, by allowing VCCP2 to float, each product term sharing fuse can be selected for verification in the same manner as previously described for array 21.

In order to program the output polarity fuses associated with each output buffer, such as fuse 27-10 associated with output buffer 27a, a plurality of a Schottky diodes 24-1 are connected as a wired AND gate in order to allow input signals applied on direct input bus 33-1; routed through programming column decoders 23, to select a desired output buffer. VCCP2 is then pulsed high, causing transistor Q612 to provide a large amount of current through fuse 27-10 to VCC3 thereby causing fuse 27-10 to be blown. Fuse 27-10 can be verified by first selecting fuse 27-10 utilizing the wired AND Schottky diodes 24-1, and causing VCCP2 to float. Polarity fuse verify transistor 27-11 has its collector and emitter connected in parallel with the collectors and emitters of the verify transistors associated with array 21, thereby allowing output polarity programming fuse 27-10 to be verified.

In accordance with the teachings of one embodiment of this invention, a number of test features are utilized to allow the manufacturer to adequately test its product prior to shipment to a customer. One such test feature is located in ECL input buffers 32. Test input lead 32-15 is connected via diodes to any convenient source of a test input signal, in one embodiment an input pin other than the input pin feeding data to input buffers 32. By applying a voltage level substantially below a logical zero level to test input lead 32-15, diodes D11, D12, and D13, turn on. This causes low voltages to be applied to the collectors of transistors Q12 and Q13 which in turn causes both I1 and Ī1 output signals to be low. This allows individual rows within array 21 to be high, rather than the normal condition where half of the rows within 21 are selected and half are deselected. This allows specialized testing of individual rows within array 21 by the manufacturer. Transistors Q111 and Q112 prevent transistors Q12 and Q13 from saturating when this test feature is enabled. Of course, transistor Q111, Q112, and diodes D11, D12, D13 and resistor R12 can be omitted if this test feature is not desired.

Another test feature shown in FIG. 3d is the ability to test the output buffers, such as output buffer 27a, in both inverting and noninverting states without the need for opening polarity fuse 27-10. Thus, the manufacturer can insure that output buffer 27 will work regardless of whether the customer wishes it to operate as an inverting or noninverting buffer while still leaving fuse 27-10 intact, allowing the customer to make the choice. By applying a low voltage level to test input terminal 27-15, diode D614 conducts, thus pulling down the anode of diode D69, thus preventing current from flowing through diodes D69, D610 and D612, thereby turning off transistor Q611 just as transistor Q611 would be turned off if fuse 27-10 is open. The low level test signal applied to terminal 27-10 can be applied from any convenient source, for example a unique test pad available at wafer sort, or the use of an extended low level input signal applied to a selected one of the input terminals.

The specific embodiments of this invention described in this specification are intended to serve by way of example and are not a limitation on the scope of my invention. Numerous other embodiments of this invention will become apparent to those of ordinary skill in the art in light of the teachings of this specification.

TABLE I

| | EXTERNAL DEVICE PINS | | | |
| --- | --- | --- | --- | --- |
| | (TTL) PROGRAMMING MODE | | (ECL) OPERATING MODE | |
| PIN | NAME | FUNC. | NAME | FUNC. |
| 1, 2, 3, 9, 10, 11, 13, 14, 15, 21, 22, 23 | $IP_n$ | TTL Compatible Input levels for selecting fuse address | $I_n$ | ECL Compatible Input levels for PLA |
| 4, 5, 7, 8, 16, 17, 20 | | No function (open) | $O_n$ | ECL Compatible Output levels for PLA |
| 19 | $O_V$ | Verify Output levels (TTL Open-collector) | $O_n$ | ECL Compatible Output levels for PLA |
| 6 | Vcc1 | 12V, DC bias for programming circuitry | Vcc1 | 0V Collector supply for output pins 4, 5, 7, 8 |
| 18 | Vcc2 | 9V pulse for opening selected fuse | Vcc2 | 0V Collector supply for output pins 16, 17, 19, 20 |
| 24 | Vcc3 | 0V, disables ECL circuitry when grounded in TTL mode | Vcc3 | 0V, enables ECL circuitry with Vee = −5.2 |
| 12 | VEE | 0V, ground pin for all ECL & TTL circuitry | VEE | −5.2V, biases ECL circuitry |
| | INTERNAL ONLY | | | |
| | VCCP1 | ~5V DC bias for programming circuitry | VCCP1 | −5.2V to disable programming circuitry |

TABLE I-continued

| | | | | |
|---|---|---|---|---|
| | VCCP2 | ~7.4V pulse for opening selected fuse | VCCP2 | −.5V, Supplies array current |
| | VCCP1S | ~7.4V Pulse applied to row & column driver during opening of selected fuse | VCCP1S | −5.2V disables programming circuitry |

| | INTERNAL PINS | | | |
|---|---|---|---|---|
| | (TTL) PROGRAMMING MODE | | (ECL) OPERATING MODE | |
| PIN | NAME | FUNC. | NAME | FUNC. |
| | VCS | 0 | VCS | VEE + 1.3V |
| | VBB | 0 | VBB | VCC3 − 1.3V |
| | VBB' | 0 | VBB' | VCC3 − 2.1V |
| | VBB" | 0 | VBB" | VCC3 − 2.9V |

I claim:

1. A logic array for receiving a plurality of input signals and providing one or more product terms comprising:

ECL array means for combining a plurality of input signals and providing at least one product term, said ECL array means having a plurality of programming means arranged in a matrix of N rows by M columns, where N and M are positive integers;

ECL input buffer means for receiving ECL input signals and providing signals to said array;

ECL output buffer means for receiving said at least one product term and providing an ECL output signal corresponding to each said at least one product term;

a plurality of access means, one for each of said programming means and being coupled to its associated programming means;

means for directly testing the programmed state of each said programming means in response to test input signals having signal levels other than ECL voltage levels; and means for providing a verify output signal in response to the programmed state of a programming means being tested, said verify output signal not being dependent on the state of said one or more product terms.

2. A logic array as in claim 1 wherein said access means comprise a bipolar transistor having a first current handling terminal connected to a supply voltage, a second current handling terminal connected to one end of its associated programming means, and a control terminal connected to receive an input signal, and wherein said means for directly testing comprises a verification transistor having a first current handling terminal connected to a supply voltage, a second current handling terminal connected to said means for providing a verify output signal, and a control terminal connected to said control terminal of said access means.

3. A logic array as in claim 2 which comprises a plurality of said verification transistors, each uniquely associated with one of said N rows, each of said first current handling terminals of said plurality of verification transistors being connected in common and each of said second current handling terminals of said plurality of verification transistors being connected in common.

4. A logic array as in claim 2 wherein said means for providing a verify output signal comprises:

a verify output transistor having a control terminal for receiving signals from said verification transistor, a first current handling terminal connected to a supply voltage, and a second current handling terminal for providing said verify output signal at a verify output terminal.

5. A logic array as in claim 4 which further comprises a verification fuse connected in series with said verification transistor second current handling terminal and said verify output terminal.

* * * * *

UNITED STATES PATENT AND TRADEMARK OFFICE
CERTIFICATE OF CORRECTION

PATENT NO. : 4,864,165
DATED : September 5, 1989
INVENTOR(S) : Hoberman et al.

It is certified that error appears in the above-identified patent and that said Letters Patent is hereby corrected as shown below:

Col. 2, line 68, "OUTPUT ENABLE" should read --$\overline{\text{OUTPUT ENABLE}}$--.

Col. 4, line 18, "I1" should read --$\overline{\text{I1}}$--.

Col. 4, line 63, "I1" should read --$\overline{\text{I1}}$--.

Col. 4, line 67, "I1" should read --$\overline{\text{I1}}$-- (second occurrence).

Col. 6, line 19, "I1" should read --$\overline{\text{I1}}$-- (second occurrence).

Col. 7, line 7, "IP1" should read --$\overline{\text{IP1}}$--.

Col. 7, line 21, "parts" should read --pairs--.

Col. 10, line 3, "I1" should be --$\overline{\text{I1}}$-- (second occurrence).

Col. 11, the VCC3's should read --$V_{cc3}^{--}$--.

Col. 6, line 24, "I1" should read --$\overline{\text{I1}}$--.

Signed and Sealed this

Fourth Day of February, 1992

Attest:

HARRY F. MANBECK, JR.

*Attesting Officer*  *Commissioner of Patents and Trademarks*